Figure 1:
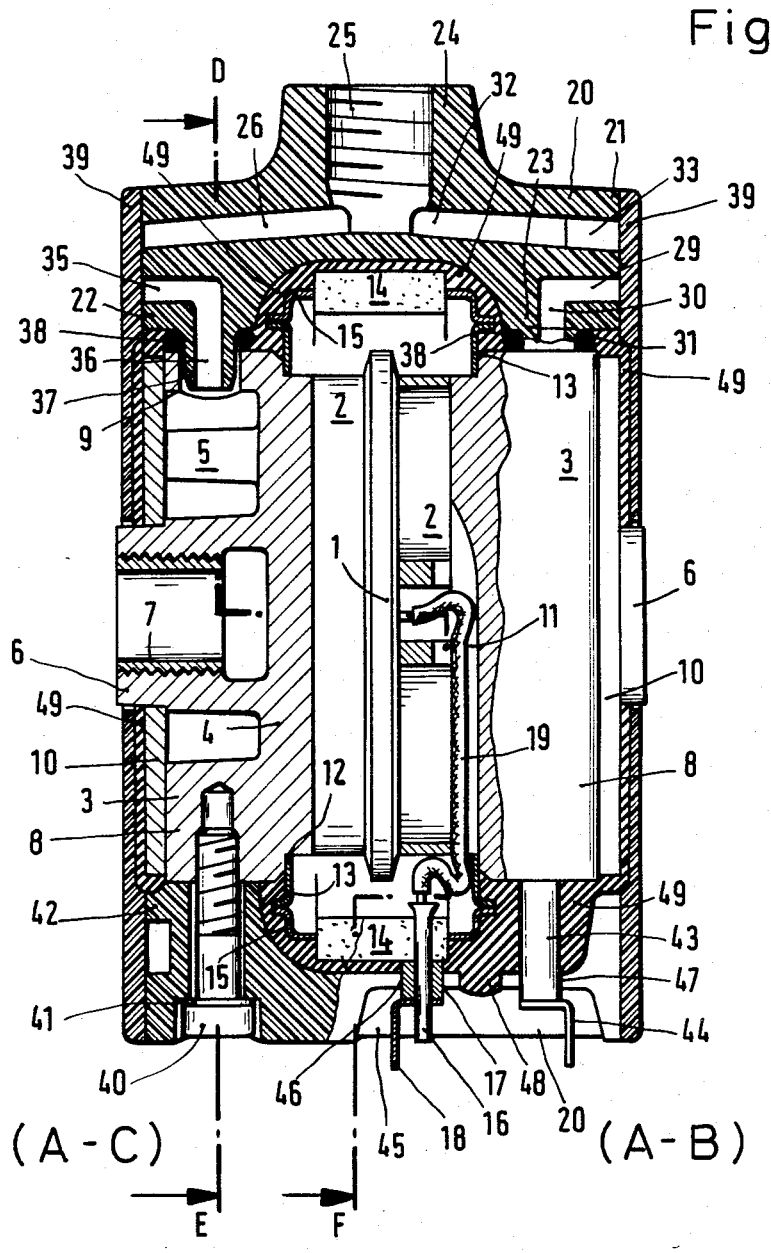

United States Patent [19]

Klein

[11] Patent Number: 4,521,170
[45] Date of Patent: Jun. 4, 1985

[54] POWER SEMICONDUCTOR COMPONENT FOR LIQUID COOLING

[75] Inventor: Erwin Klein, Heddesheim, Fed. Rep. of Germany

[73] Assignee: Brown, Boveri & Cie. AG, Mannheim-Kaefertal, Fed. Rep. of Germany

[21] Appl. No.: 419,832

[22] Filed: Sep. 17, 1982

[30] Foreign Application Priority Data

Sep. 19, 1981 [EP] European Pat. Off. ............ 81107465

[51] Int. Cl.³ ...................... H01L 23/34; H01L 23/46
[52] U.S. Cl. ......................................... 357/81; 357/82
[58] Field of Search ................ 357/82, 81; 165/80 C, 165/80 E

[56] References Cited

U.S. PATENT DOCUMENTS

| | | | |
|---|---|---|---|
| 3,654,528 | 4/1972 | Barkan | 357/81 X |
| 3,823,771 | 7/1974 | Ludwig | 357/82 X |
| 4,188,996 | 2/1980 | Pellant et al. | 165/80 C |
| 4,366,497 | 12/1982 | Block et al. | 357/82 |

FOREIGN PATENT DOCUMENTS 2705476 8/1978 Fed. Rep. of Germany ........ 357/82
2716066 10/1978 Fed. Rep. of Germany ........ 357/82

Primary Examiner—Andrew J. James
Assistant Examiner—Sheila V. Clark
Attorney, Agent, or Firm—Herbert L. Lerner; Laurence A. Greenberg

[57] ABSTRACT

A power semiconductor component for liquid cooling, includes a semiconductor crystal disc which has at least one pn-junction and two main electrodes which are connected through thermally and electrically conducting multicontacts to thermally and electrically conducting heat sink discs. Together with a circular ceramic ring and further ring-shaped parts, the heat sink discs form a liquid-tight housing around which a cooling liquid can flow. The heat sink discs form the bottom of cooling capsules with a wall, a cover and cooling rods in the interior of the capsules, through which the coolant can flow. The cooling capsules are provided with openings for feeding in and discharging the coolant. The covers of the cooling capsule are provided with electrical connecting eyes. Two half-shells with hydraulic connecting eyes are provided as an outer insulating housing, having a multibranch canal system from holes formed in the connecting eyes of the half-shells to the cooling capsule openings.

10 Claims, 2 Drawing Figures (D-F)    (D-E)

POWER SEMICONDUCTOR COMPONENT FOR LIQUID COOLING

The invention relates to a power semiconductor component for liquid cooling, including a semiconductor crystal disc which has at least one pn-junction and two main electrodes which are connected through thermally and electrically conducting multicontacts to thermally and electrically conducting heat sink discs, the heat sink discs, in connection with a circular ceramic ring and further ring-shaped parts, forming a liquid-tight housing around which a cooling liquid can flow.

Such a power semiconductor component for liquid cooling is known from German Published, Non-Prosecuted Application DE-OS No. 28 55 493. There, the multicontacts consist of a brush-like bundle of individual wires where at least part of the individual wires have a greater length than corresponds to the distance between the two disc surfaces. Preferably, each bundle is twisted with respect to the geometric central axis which is perpendicular to the two main surfaces of the semiconductor disc. The multicontacts are connected with self-substance to the semiconductor crystal disc and to the heat sink disc. Relative motions between the semiconductor crystal disc and the heat sink disc during operation due to heating-up of the component are taken up by the multicontacts (multi-spring contacts). The multicontacts furthermore have excellent electric and thermal conductivity.

From German Published, Non-Prosecuted Application DE-OS No. 29 37 049, a similar power semiconductor component is known in which the bundle forming the multicontacts consists of a metal ribbon wound-up to form a spiral, where the ribbon is provided at regular intervals with transverse slots so that a multiplicity of resilient metal webs is produced which are connected on one side by a non-slotted section of the metal ribbon.

From German Published, Non-Prosecuted Application DE-OS No. 29 38 096, a power semiconductor component is known in which the multicontacts serve exclusively for carrying current and not for heat removal. The interior of the housing and therefore, the semiconductor crystal disc itself are traversed by a cooling medium. In this power semiconductor component, the coolant must be electrically insulating.

While in the last-mentioned power semiconductor component, coolant flows around the multicontacts, they are hermetically sealed in the two first-mentioned power semiconductor components by means of a separate housing. However, a detailed embodiment of such a component specifically for liqid cooling with a non-insulating coolant is not described in any of the publications cited.

It is an object of the invention to describe, in a power semiconductor component for liquid cooling of the type mentioned at the outset, a detailed embodiment of an element, ready to be connected electrically and coolant-wise, for use of an electrically non-insulating coolant, wherein a disc cell designed without force-locking contact is to be provided.

This problem is solved by constructing the heat sink discs as the bottom of cooling capsules with a wall, a cover and cooling rods in the interior of the capsules, through which the coolant can flow, the cooling capsules being provided with openings for feeding in and discharging the coolant, and the covers of the cooling capsules being provided with electrical connecting eyes, and two half-shells with hydraulic connecting eyes forming an outer insulating housing, having a multi-branch canal system from the holes of the connecting eyes of the half-shells to the cooling capsule openings.

The advantages obtainable with the invention consist particulary in that the power semiconductor component is electrically and hydraulically insulated and need not be contacted in a force-locking manner (which is important for large semiconductor crystal disc diameters) but is nevertheless cooled very efficiently. Through the proposed arrangements of the canals, hydraulic paths are generated with such lengths that water can be used as the coolant in spite of a high inverse voltage. Since there are no force-locking contacts, the relative motions which occur when the element is heated up in operation, due to different expansion coefficients of the parts joined together with self-substance can no longer impair the fatigue strength of the elements. The thermal resistance of the component is advantageously low. Through the proposed housing design, the self-substance joints are shear- and tensile-stress relieved. The component is suited particularly as a discrete component of a block composed of many similar power semiconductor components, the accessibility of the individual components being very good (which is important for replacement of defective building blocks).

Advantageous further embodiments of the invention are characterized in the subclaims.

In the following, the invention will be explained with the aid of the embodiment example shown in the drawings.

Figure 2:
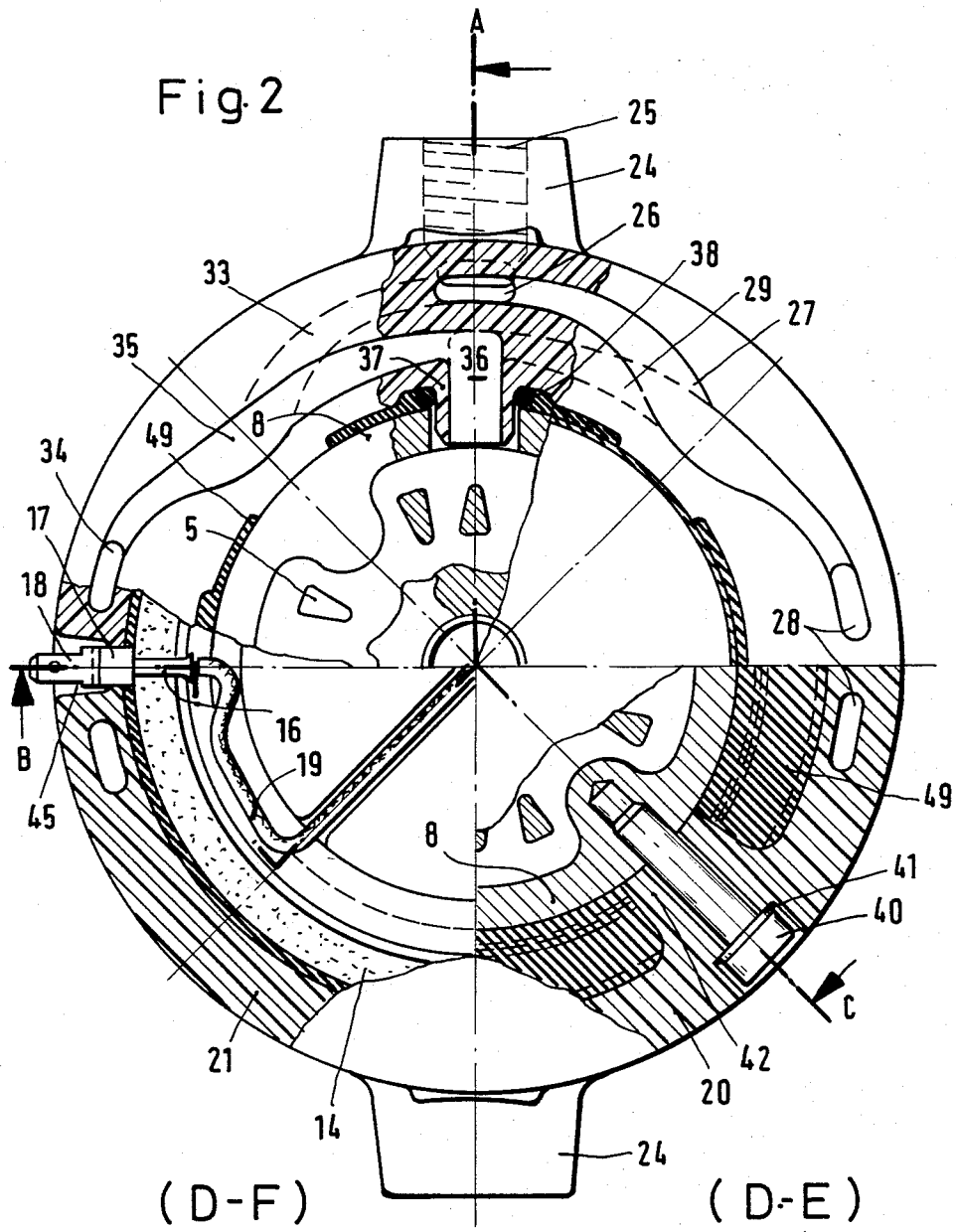

FIG. 1 shows the power semiconductor component in a side view in two sections, and FIG. 2 shows the power semiconductor component in a top view, in two sections.

In FIG. 1, the power semiconductor component is shown in a side view in two sections A-B and A-C. The respective section lines A, B and C can be seen from FIG. 2.

A semiconductor crystal disc 1 contained in the interior of the semiconductor power component is connected via each of its two main electrodes to multicontacts 2 (multi-spring contacts) in a self-substance connection. These multicontacts 2 are adjoined by a cooling capsule 3 each in a material-locking manner. The cooling capsules 3 consist of a bottom 4, at which cooling rods 5 and an electrical terminal eye 6 with internal thread 7 are formed for electrical connection of the power semiconductor component. The cooling capsules 3 further have a wall 8 with two openings 9 and a cover 10 put in place with material contact. In the bottom 4 of the cooling capsules 3, a slot 11 is provided. If the power semiconductor component is realized as a thyristor, a gate terminal line 19 is placed in the slot 11. In addition, the bottom 4 of the cooling capsules 3 has a lathe cut 12 to which a membrane 13 is fastened with material contact.

These parts, forming a subassembly, are placed in a housing consisting of a ceramic ring 14 with a collar 15 added-on with material contact. The already mentioned gate terminal line 19 is inserted into a pumping stub 16 which penetrates the ceramic ring 14 and is connected via a spacer tube 17 to an electrical contact pin 18, for later electric connection. The membrane 13 and the collar 15 are joined together with material contact after the assembly.

After this operation, a housing, which may be formed of thermoplastic material, in the form of two half-shells 20 designed with mirror symmetry is placed over the already constructed subassembly and fastened to the cooling capsules 3. The half-shells 20 consist of a wall 21 with rims 22 and 23 extending inward at top and bottom and a hydraulic connecting eye 24 protruding outward. The "upper" part of the power semiconductor component in this case is the part arranged at the left of the semiconductor crystal disc 1 in FIG. 1, and the lower part is the part arranged to the right of the semiconductor crystal disc. In the connecting eye 24, a hole 25 with an internal thread is provided for connecting a hydraulic coolant line.

From the hole 25, a canal 26 extends upward and opens into a groove 27 (see in this connection FIG. 2). The latter leads via approximately a quarter circle to a canal 28 leading downward (see in this connection FIG. 2) which in turn opens into a groove 29. The latter leads back by the same angle to an opening 30 of a nozzle 31 which protrudes inward into the opening 9 of the lower cooling capsule 3.

From the hole 25, a similar liquid path leads downward via a canal 32, a groove 33, a canal 34 (see in this connection FIG. 2), a groove 35 as well as an opening 36 of a nozzle 37, which protrudes into an opening 9 of the upper cooling capsule 3.

The nozzles 31/37 are sealed against the cooling capsules 3 by O-rings 38. The grooves 27/29 (see FIG. 2) and 33/35 (see FIG. 2) become tight canals by placing two semicircular washers 39 of insulating material on the rims 22/23 and joining them with material contact. The washers 38 also cover the cooling capsules 3 with insulation except for the electric connecting eyes 6. The above-described arrangement of the canals, provides a length of the cooling lines which permits operation with water as the coolant in spite of a high inverse voltage at the power semiconductor component.

The canal system described supplies the two cooling capsules 3 of the power semiconductor component with coolant via the hydraulic connecting eye 24, i.e. coolant is conducted into the interior of the cooling capsules. The coolant which has been heated up by the dissipation heat of the semiconductor crystal 1 is removed in the same manner via similarly designed non-illustrated canals, grooves and openings, to the second hydraulic connection 24. The heat is transported from the hot semiconductor crystal disc 1 via the multicontacts 2 to the bottom 4 of the cooling capsule and to the cooling rods 5. Via the cooling capsule rods 5 and the cooling capsule wall 8, the cooling capsule cover 10 is also warmed up. The cooling liquid flows around the cooling rods 5 and likewise acts on the bottom 4, the wall 8 and the lid 10 of the cooling capsule 3.

The cooling liquid does not act directly on the multicontacts 2 because the latter are sealed by the cooling capsule bottom, the membranes 13 the collars 15 and the ceramic ring 14 against the cooling liquid. The half-shells 20 are fastened to the cooling capsule 3 via several screws 40 with securing elements 41. To this end, inward-extending eyes 42 (see in this connection FIG. 2) are arranged at the wall 21 of the half-shells 20. By means of these screw connections, relief from forces which might act on the solder joints of the multicontacts 2 is obtained.

In a power semiconductor component designed as a thyristor, an auxiliary cathode terminal is advantageously also brought out, besides the gate terminal. This is accomplished by a rod 43 which is connected to the cooling capsule 3 with substantive contact, pierces the wall 21 of the housing half-shell 20 and has a flat plug 44 disposed thereon.

At the parting points of the two half-shells 20, the gate and cathode terminals are brought to the outside for which purpose a depression 45 and two semicircular recesses 46/47 are made therein.

After the half-shells 20 are mounted and fastened to the already assembled subassembly, an insulating closed-pore filler 49 is injected through an opening 48 in the half-shell 20 in the vicinity of the depression 45. A non-illustrated opening arranged diametrically opposite the opening 48 permits the air to leave during the filling process and allows control of the filling state of the substance 49.

By inserting the filler 49, two effects are achieved. For one, subsequent contamination and/or dew deposition on the ceramic ring 14, is prevented for impairing the insulation of the power semiconductor component; secondly, the sealing of the liquid in the cooling capsule 3 and the nozzles 31/37 is permanently assured.

In FIG. 2, the power semiconductor component is shown in a top view in two sections D-E and D-F. The respective section lines D, E and F can be seen in FIG. 1. From FIG. 2 can especially be seen the arrangement of the canals: hole 25 of the hydraulic connecting eye 24 upper canal 26, upper groove 27, canal 28 and downward-lower groove 29, as well as the canal arrangement: lower groove 33 upper groove 35 and upper opening 36 of the nozzle 37. Further shown are the cooling rods 5 as well as the wall 8 of the cooling capsules 3, the screw 40 going through the eye 42 of the half-shell 20 with the securing element 41, the gate terminal line 19 with a pumping stub 16, spacer tubes 17 as well as the electrical contact pins 18, the wall 21 with the depression 45, the ceramic ring 14, the O-rings 38 as well as the filler 49.

I claim:

1. Power semiconductor component for liquid cooling, comprising a semiconductor crystal disc having at least one pn-junction and two main electrodes; two thermally and electrically conducting multicontacts each being connected to a respective one of said main electrodes; cooling capsules each including a wall, a bottom and a cover defining an interior space, and cooling rods disposed on said bottoms in said interior space, said bottoms being in the form of thermally and electrically conducting heat sink discs each being connected to a respective one of said multicontacts, said cooling capsules having openings formed therein for receiving and discharging coolant, and said covers having electrical connecting eyes formed thereon; an inner liquid-tight housing surrounding said semiconductor crystal disc including a ceramic ring, additional ring-shaped parts and said heat sink discs; and an outer insulating housing including two ceramic half-shells having hydraulic connecting eyes formed thereon with holes formed therein, and a multibranch canal system for conducting coolant through said interior space and around said interior liquid-tight housing between said holes formed in said hydraulic connecting eyes and said openings formed in said cooling capsules.

2. Power semiconductor component according to claim 1 wherein from the hole (25) of each hydraulic connecting eye (24), two lateral canals (26, 32) branch off which open into grooves (27, 33) which are arranged parallel to the disc surfaces, and are connected, via canals (28, 34) positioned perpendicularly thereto, to further grooves (29, 35) arranged on the respective opposite disc surface, which lead via openings (30, 36) and nozzles (31, 37) to the cooling capsules (3).

3. Power semiconductor component according to claim 2, including O-rings (38) provided for the seal between the nozzles (31, 37) and the openings (9) of the cooling capsules (3).

4. Power semiconductor component according to claim 1, wherein the ceramic ring (14) is connected to the cooling capsules (3) via ring-shaped collars (15) and ring-shaped membranes (13).

5. Power semiconductor component according to claim 4, wherein the cooling capsule bottom (4) is provided with a circular cut (12) for receiving the mambrane (13).

6. Power semiconductor component according to claim 1, wherein the half-shells (20) are covered parallel to the disc surface with semicircular insulating washers (39) where the washers (39) cover the grooves (27, 29, 33, 35) but leave the electrical connecting eyes (6) free.

7. Power semiconductor component according to claim 1, wherein the space bounded by cooling capsules (3), half-shells (20) and liquid-tight housing is provided with a filler (49).

8. Power semiconductor component according to claim 1 wherein the half-shell (20) is connected to the cooling capsules (3) via screws (40).

9. Power semiconductor component according to claim 1, including an internal gate terminal line (19) connected through a slot (11) in the cooling capsule bottom (4) and a hole in the multicontact (2), to the control terminal of the semiconductor crystal disc (1) and through a pumping stub (16) through the ceramic ring (14) to an external electrical contact pin (18).

10. Power semiconductor component according to claim 1, including an external auxiliary terminal provided in the form of a rod (43) which pierces the half-shells (20) and is connected through substantial contact to the cooling capsules (3).

* * * * *